(12) United States Patent
Lee

(10) Patent No.: US 12,742,816 B2
(45) Date of Patent: Sep. 22, 2026

(54) TEST ENVIRONMENT CONTROL SYSTEM

(71) Applicant: YISHI Industrial Co., Ltd, Miaoli County (TW)

(72) Inventor: Wen-Hsin Lee, Hsinchu County (TW)

(73) Assignee: YISHI INDUSTRIAL CO., LTD, Miaoli County (TW)

( * ) Notice: Subject to any disclaimer, the term of this patent is extended or adjusted under 35 U.S.C. 154(b) by 183 days.

(21) Appl. No.: 18/800,143

(22) Filed: Aug. 12, 2024

(65) Prior Publication Data

US 2025/0116699 A1 Apr. 10, 2025

(30) Foreign Application Priority Data

Oct. 5, 2023 (TW) ................................ 112138192

(51) Int. Cl.
*G01R 31/28* (2006.01)

(52) U.S. Cl.
CPC ..... *G01R 31/2877* (2013.01); *G01R 31/2862* (2013.01); *G01R 31/2867* (2013.01); *G01R 31/2875* (2013.01); *G01R 31/2881* (2013.01)

(58) Field of Classification Search
CPC ........... G01R 31/2877; G01R 31/2862; G01R 31/2867; G01R 31/2875; G01R 31/2881
See application file for complete search history.

(56) References Cited

U.S. PATENT DOCUMENTS

| | | | | |
|---|---|---|---|---|
| 7,138,811 | B1 * | 11/2006 | Mahoney | G01R 31/2889 324/762.02 |
| 10,966,349 | B1 | 3/2021 | Lau | |
| 2020/0124299 | A1 * | 4/2020 | Sugitani | F24F 11/74 |

FOREIGN PATENT DOCUMENTS

| | | | |
|---|---|---|---|
| CN | 104615169 | A | 5/2015 |
| TW | 202219682 | A | 5/2022 |

* cited by examiner

*Primary Examiner* — Stephanie E Bloss
*Assistant Examiner* — Michael A Harrison
(74) *Attorney, Agent, or Firm* — Li & Cai Intellectual Property Office

(57) ABSTRACT

A test environment control system includes a pressure-resistant container, a temperature control device that is at least partially arranged in the pressure-resistant container, and a plurality of contactless test devices that are connected to the pressure-resistant container. The pressure-resistant container is configured to store a dry gas therein that has a dew point temperature less than −10° C. and that has more than 1 atm. The temperature control device is immersed in the dry gas, and is capable of changing a temperature of the dry gas in the pressure container to a predetermined value. Moreover, a control valve of the pressure-resistant container can selectively output the dry gas having the predetermined temperature into at least one of the contactless test devices, so as to establish a predetermined test environment.

19 Claims, 10 Drawing Sheets

4
4-1
42
422
421
4221
4-31
4-32
431
4121
4311
4122
4112
4111
43
DUT
4222
4211
415
414
411
413
412
41
4321
432
4-2
4-33
4-34
4-3

TEST ENVIRONMENT CONTROL SYSTEM

CROSS-REFERENCE TO RELATED PATENT APPLICATION

This application claims the benefit of priority to Taiwan Patent Application No. 112138192, filed on Oct. 5, 2023. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a test system, and more particularly to a test environment control system.

BACKGROUND OF THE DISCLOSURE

When a conventional test device is operated to test a device under test (DUT), the conventional test device needs to use a temperature control component (e.g., a heater) to abut against the DUT, thereby enabling the DUT to meet a predetermined temperature for test requirements. However, the above configuration of the conventional test device is gradually becoming incompatible with changes and needs of the electronic industry.

SUMMARY OF THE DISCLOSURE

In response to the above-referenced technical inadequacies, the present disclosure provides a test environment control system for effectively improving on the issues associated with conventional test devices.

In order to solve the above-mentioned problems, one of the technical aspects adopted by the present disclosure is to provide a test environment control system, which includes a pressure-resistant container, a temperature control device, and a plurality of contactless test devices. The pressure-resistant container includes a gas storage room and a control valve that is in spatial communication with the gas storage room. The gas storage room is configured to store a dry gas that has a dew point temperature being less than −10° C. and that has a pressure being greater than 1 atm. The temperature control device is at least partially arranged in the gas storage room and is immersed in the dry gas. The temperature control device is configured to control the dry gas in the gas storage room to arrive at a predetermined temperature. The contactless test devices are connected to the control valve of the pressure-resistant container. The control valve of the pressure-resistant container is configured to output the dry gas having the predetermined temperature from the gas storage room to a N number of the contactless test devices, selectively, for establishing a predetermined test environment in each of the N number of the contactless test devices. Moreover, N is a positive integer. At least one of the contactless test devices includes a single test socket and a gas pressure module. The single test socket is configured to perform an electrical test to a single device under test (DUT), and includes a lower chamber and an upper chamber. The lower chamber includes a signal transmitting board arranged on a bottom portion thereof. The lower chamber is configured to allow the DUT to be tightly fitted with an inner wall thereof and to be disposed on the signal transmitting board. The upper chamber is detachably assembled onto the lower chamber so as to jointly define a gas mixing room. The single test socket has a gas input channel and a gas output channel that are in spatial communication with the gas mixing room, and the gas mixing room is in spatial communication with an external space only through the gas input channel and the gas output channel. The gas pressure module is connected to the gas input channel and the gas output channel. The gas pressure module is connected to the control valve of the pressure-resistant container for allowing the dry gas to be injected into the gas mixing room from the pressure-resistant container, whereby the gas mixing room has the predetermined test environment for allowing the electrical test to be performed on the DUT.

In order to solve the above-mentioned problems, another one of the technical aspects adopted by the present disclosure is to provide a test environment control system, which includes a pressure-resistant container, a temperature control device, and a plurality of contactless test devices. The pressure-resistant container includes a gas storage room and a control valve that is in spatial communication with the gas storage room. The gas storage room is configured to store a dry gas that has a dew point temperature being less than −10° C. and that has a pressure being greater than 1 atm. The temperature control device is at least partially arranged in the gas storage room and is immersed in the dry gas. The temperature control device is configured to control the dry gas in the gas storage room to arrive at a predetermined temperature. The contactless test devices are connected to the control valve of the pressure-resistant container. The control valve of the pressure-resistant container is configured to output the dry gas having the predetermined temperature from the gas storage room to a N number of the contactless test devices, selectively, for establishing a predetermined test environment in each of the N number of the contactless test devices. Moreover, N is a positive integer.

Therefore, the test environment control system in the present disclosure can be provided with the pressure-resistant container for pre-storing the dry gas having the predetermined temperature, so that the control valve can input the dry gas into any one of the contactless test devices for quickly establishing the predetermined test environment, thereby effectively increasing an overall testing efficiency.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

Figure 1:
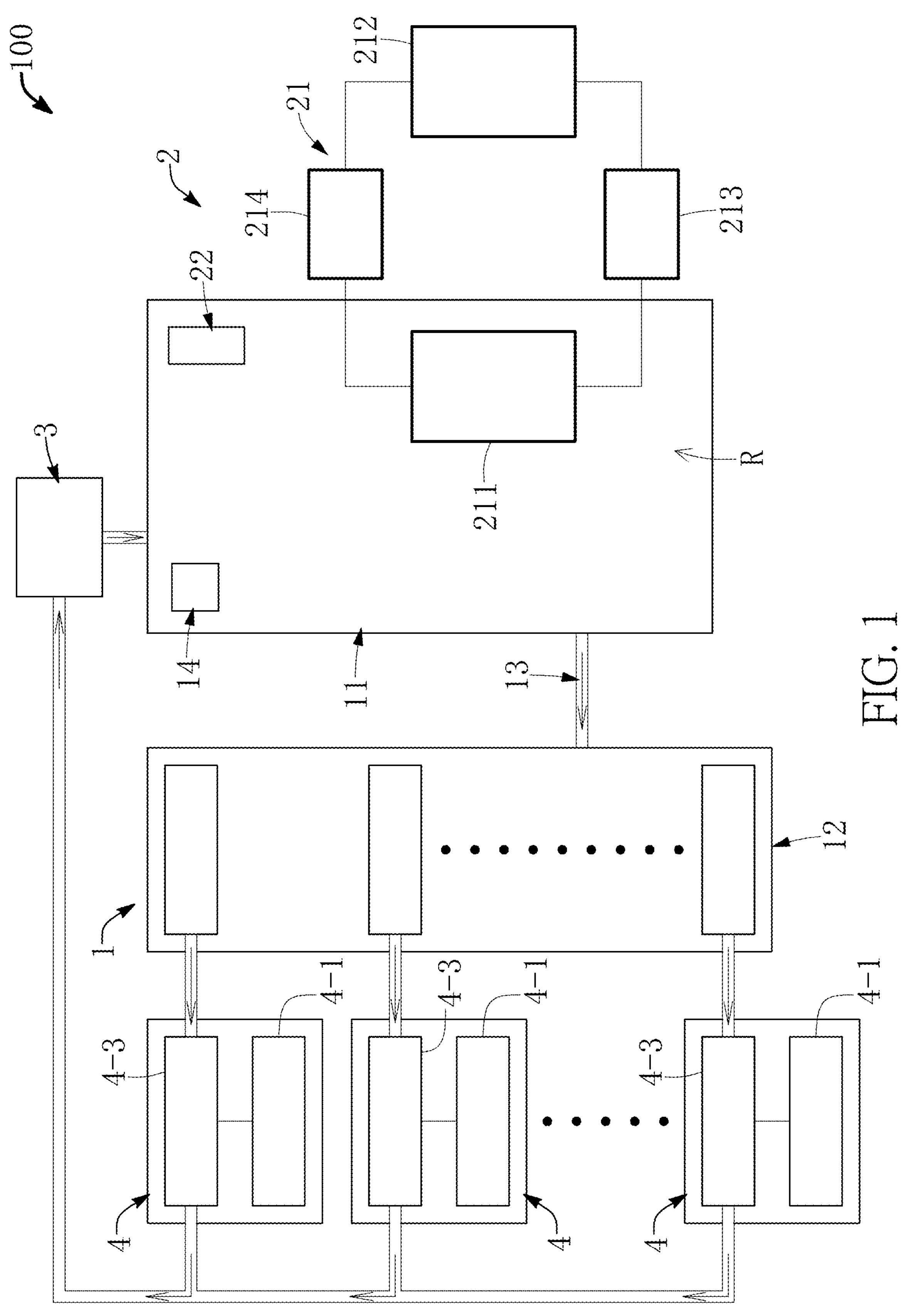
FIG. 1 is a schematic view of a test environment control system according to a first embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a," "an" and "the" includes plural reference, and the meaning of "in" includes "in" and "on." Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first," "second" or "third" can be used to describe various components, signals or the like, which are for distinguishing one component/signal from another one only, and are not intended to, nor should be construed to impose any substantive limitations on the components, signals or the like.

First Embodiment

Referring to FIG. 1 to FIG. 8, a first embodiment of the present disclosure is provided. As shown in FIG. 1, the present embodiment provides a test environment control system 100, which includes a pressure-resistant container 1, a temperature control device 2 assembled to the pressure-resistant container 1, a plurality of contactless test devices 4 connected to the pressure-resistant container 1, and a pressurizing and drying mechanism 3 that is connected in-between the pressure-resistant container 1 and the contactless test devices 4, but the present disclosure is not limited thereto. For example, in other embodiments of the present disclosure not shown in the drawings, the pressurizing and drying mechanism 3 can be omitted or can be replaced by other components.

The pressure-resistant container 1 in the present embodiment includes a first pressure-resistant tank 11, a control valve 12, a first output pipe connecting the first pressure-resistant tank 11 and the control valve 12, and a temperature sensor 14 that is arranged in the first pressure-resistant tank 11. An interior space of the first pressure-resistant tank 11 is defined as a gas storage room R that is in spatial communication with the control valve 12 through the first output pipe 13. The gas storage room R is configured to store a dry gas that has a dew point temperature being less than −10° C. and that has a pressure being greater than 1 atm.

Specifically, the gas storage room R in the present embodiment is connected to the pressurizing and drying mechanism 3, and the pressurizing and drying mechanism 3 is configured to provide the gas storage room R with the dry gas that has the dew point temperature being within a range from −30° C. to −100° C. and that has the pressure being within a range from 1.5 atm to 6 atm. Accordingly, the dry gas stored in the gas storage room R can have a high density of gas molecules, so that a heat exchange efficiency of the pressure-resistant container 1 can be effectively increased, but the present disclosure is not limited thereto. For example, in other embodiments of the present disclosure not shown in the drawings, the dew point temperature or the pressure of the dry gas provided by the pressurizing and drying mechanism 3 can be adjusted or changed according to design requirements.

The temperature control device 2 is at least partially arranged in the gas storage room R and is immersed in the dry gas. The temperature control device 2 is configured to control the dry gas in the gap-gas storage room R to arrive at a predetermined temperature that has a difference of at least 10° C. with respect to a room temperature (or a normal temperature). In the present embodiment, the temperature control device 2 includes a cooling mechanism 21 and a heater 22. The cooling mechanism 21 is at least partially arranged in the first pressure-resistant tank 11 for reducing a temperature of the dry gas in the first pressure-resistant tank 11.

Specifically, the cooling mechanism 21 in the present embodiment includes an evaporator 211, a condenser 212, an expansion valve 213, and a compressor 214. The evaporator 211 is arranged in the first pressure-resistant tank 11 for reducing the temperature of the dry gas in the first pressure-resistant tank 11. The condenser 212, the expansion valve 213, and the compressor 214 are arranged outside of the first pressure-resistant tank 11, the expansion valve 213 is arranged between an inlet of the evaporator 211 and an outlet of the condenser 212, and the compressor 214 is connected in-between an outlet of the evaporator 211 and an inlet of the condenser 212, but the present disclosure is not limited thereto.

Moreover, the heater 22 is arranged in the first pressure-resistant tank 11 for adjusting the temperature of the dry gas in the first pressure-resistant tank 11. In other words, when the temperature of the dry gas is less than the predetermined temperature, the heater 22 can be used to slightly increase the temperature of the dry gas to the predetermined temperature.

The contactless test devices 4 are connected to the control valve 12 of the pressure-resistant container 1. The control valve 12 of the pressure-resistant container 1 is configured to output the dry gas having the predetermined temperature from the gas storage room R to a N number of the contactless test devices 4, selectively, for establishing a predetermined test environment in each of the N number of the contactless test devices 4. Moreover, N is a positive integer, and is less than or equal to a quantity of the contactless test devices 4.

In other words, the control valve 12 of the pressure-resistant container 1 can selectively output the dry gas to the N number of the contactless test devices 4 and a M number of contactless test devices 4 by different flowing amount, thereby establishing different predetermined test environments. Specifically, M is positive integer, and a sum of M and N is less than or equal to the quantity of the contactless test devices 4.

Accordingly, the test environment control system 100 in the present embodiment can be provided with the pressure-resistant container 1 for pre-storing the dry gas having the predetermined temperature, so that the control valve 12 can input the dry gas into any one of the contactless test devices 4 for quickly establishing the predetermined test environment, thereby effectively increasing an overall test efficiency.

Specifically, since structures of the contactless test devices 4 have an important influence to the test efficiency, the following description describes the contactless test device 4 as having the structure for a preferred test efficiency. As the contactless test devices 4 in the present embodiment are of substantially the same structure, the following description discloses the structure of just one of the contactless test devices 4 for the sake of brevity, but the present disclosure is not limited thereto. For example, in other embodiments of the present disclosure not shown in the drawings, the contactless test devices 4 can be of different structures according to design requirements.

Figure 2:
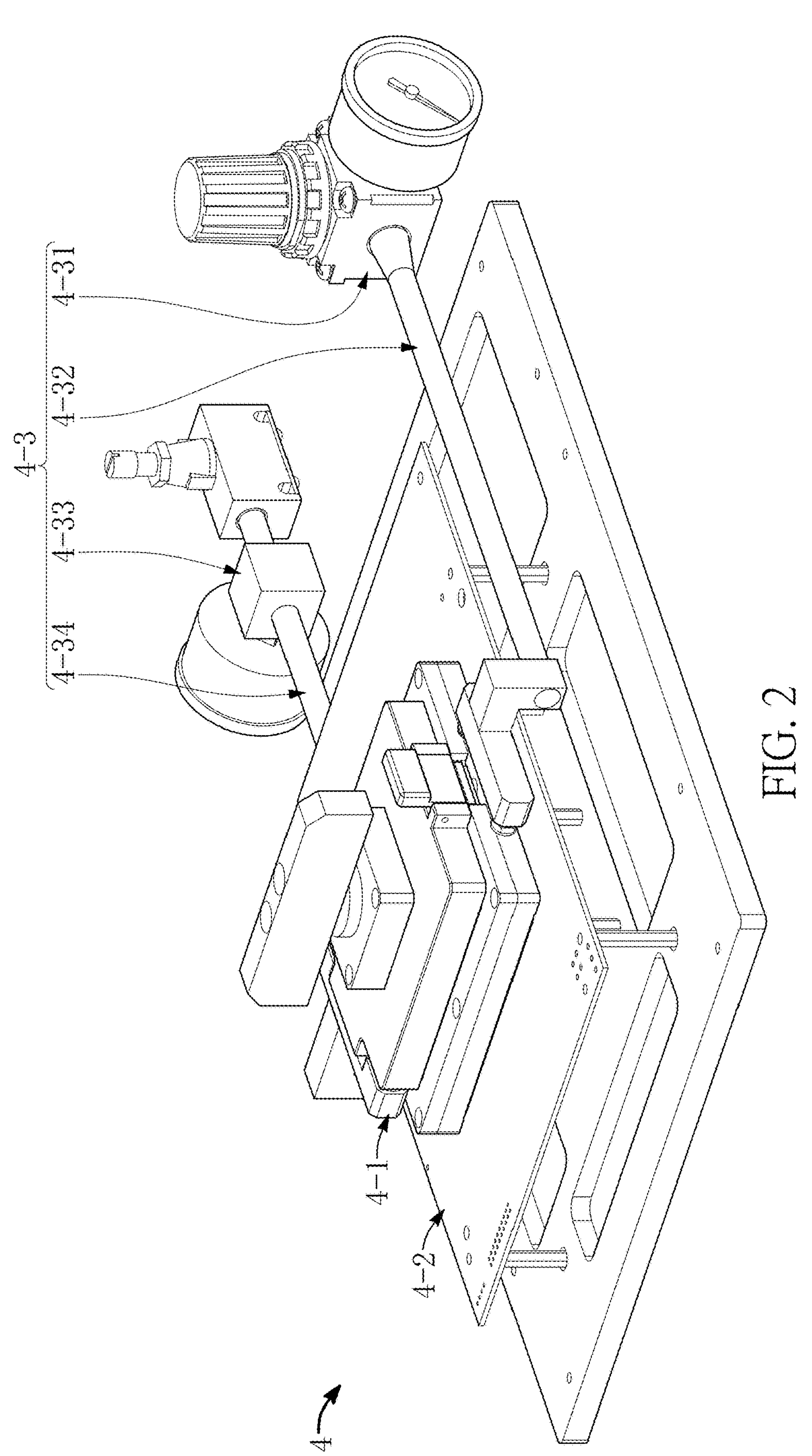
FIG. 2 is a schematic perspective view of a contactless test device of FIG. 1.
Figure 3:
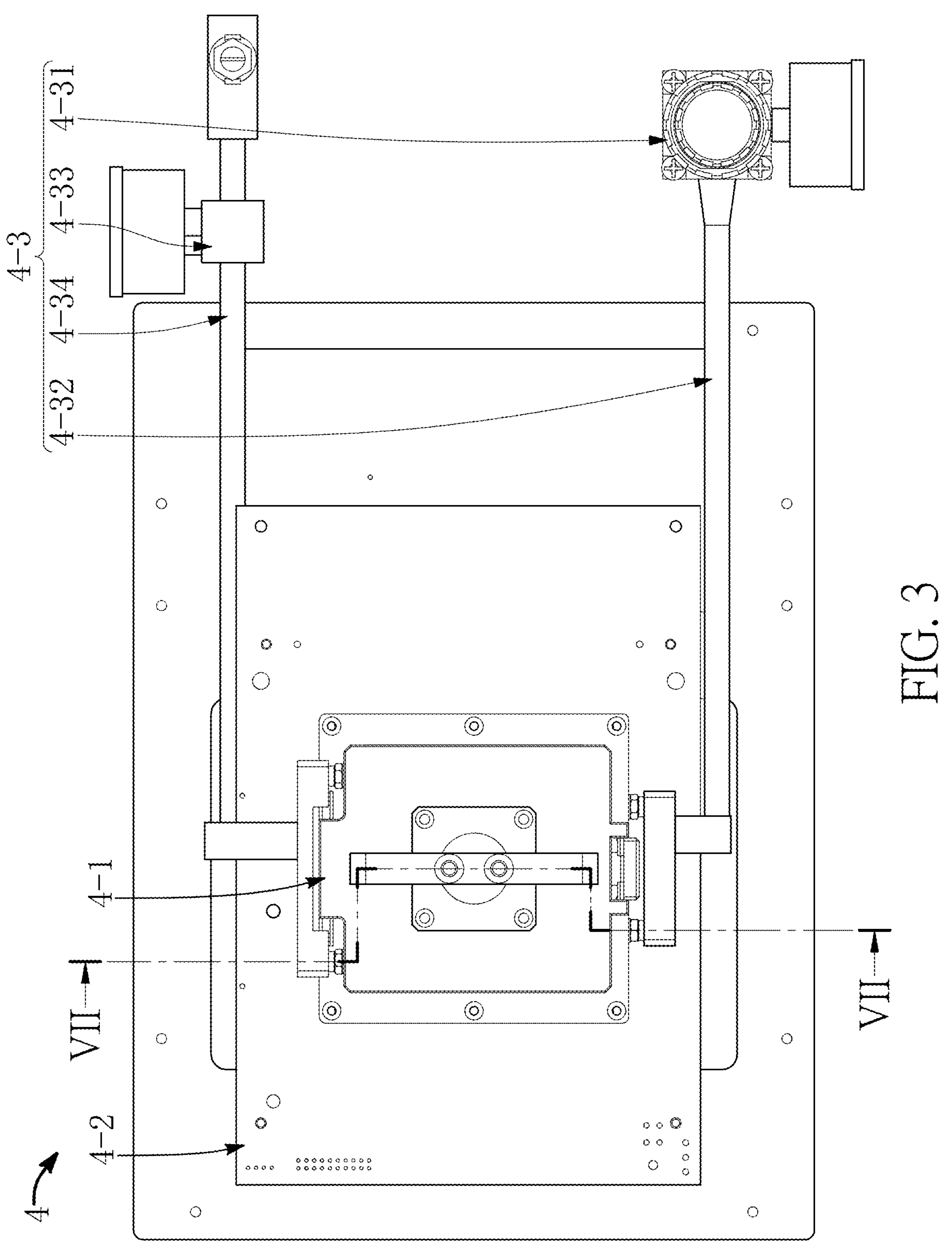
FIG. 3 is a schematic top view of FIG. 2.
Figure 4:
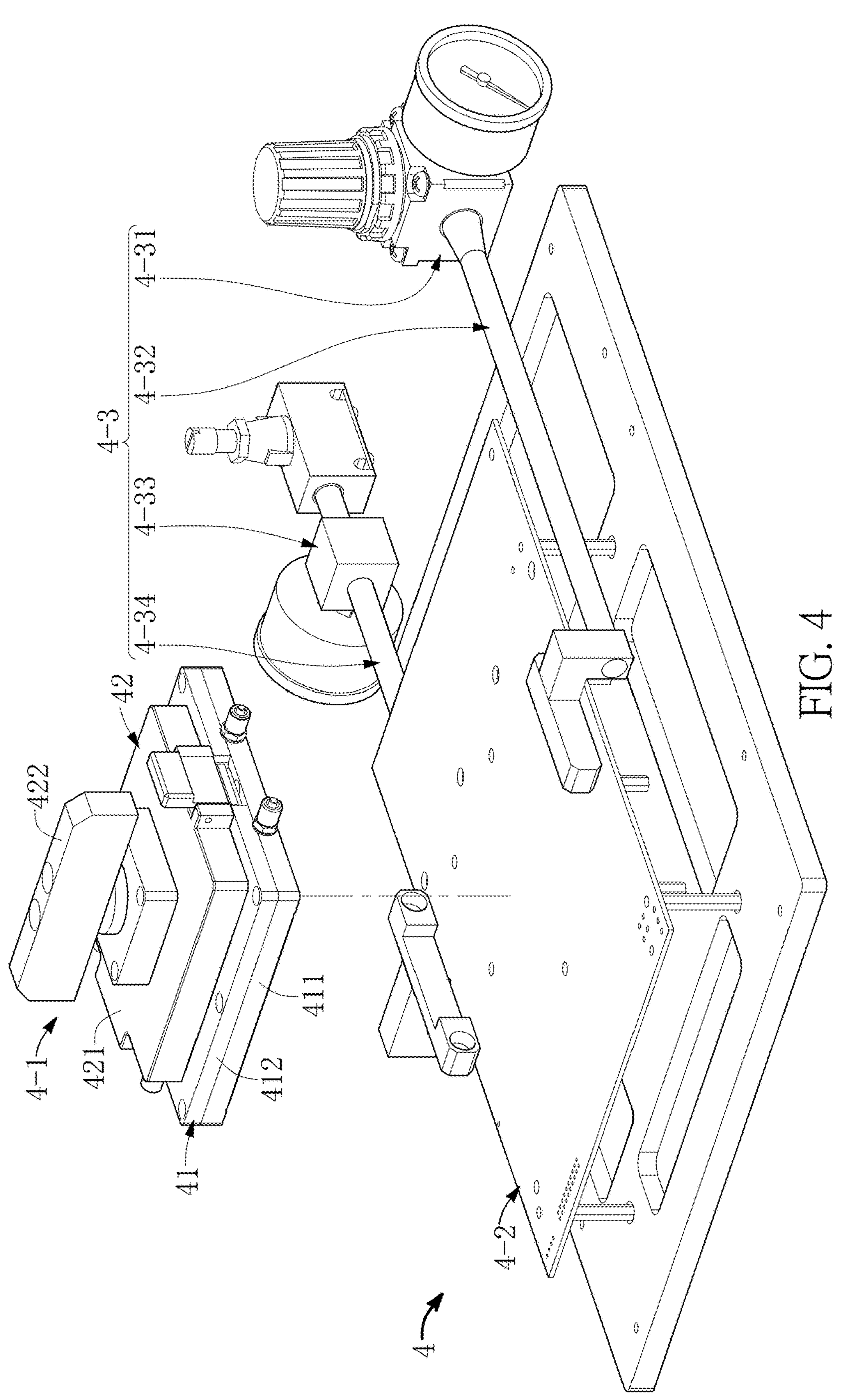
FIG. 4 is a schematic exploded view of FIG. 2.
Figure 5:
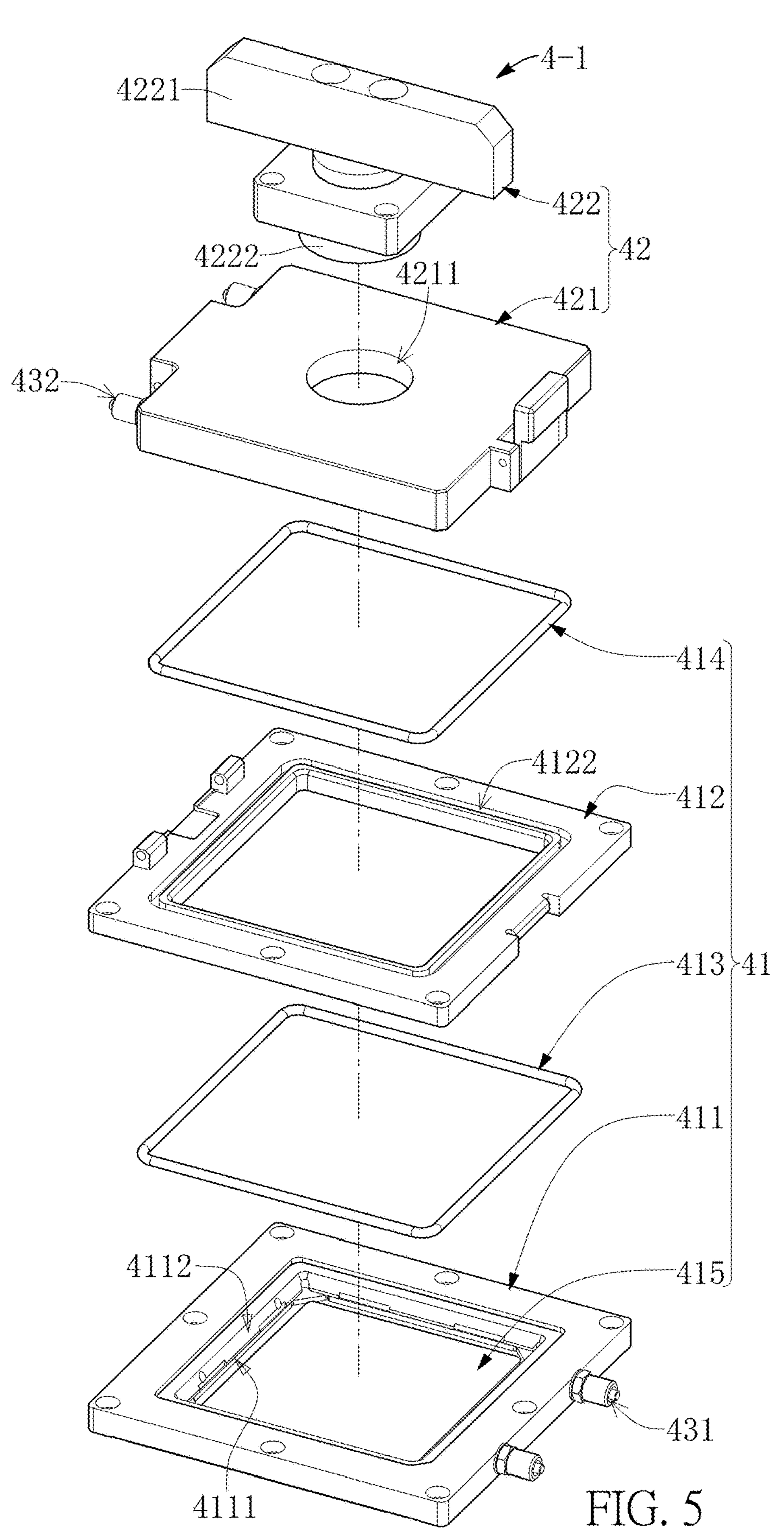
FIG. 5 is a schematic exploded view of a single test socket of FIG. 4.
Figure 6:
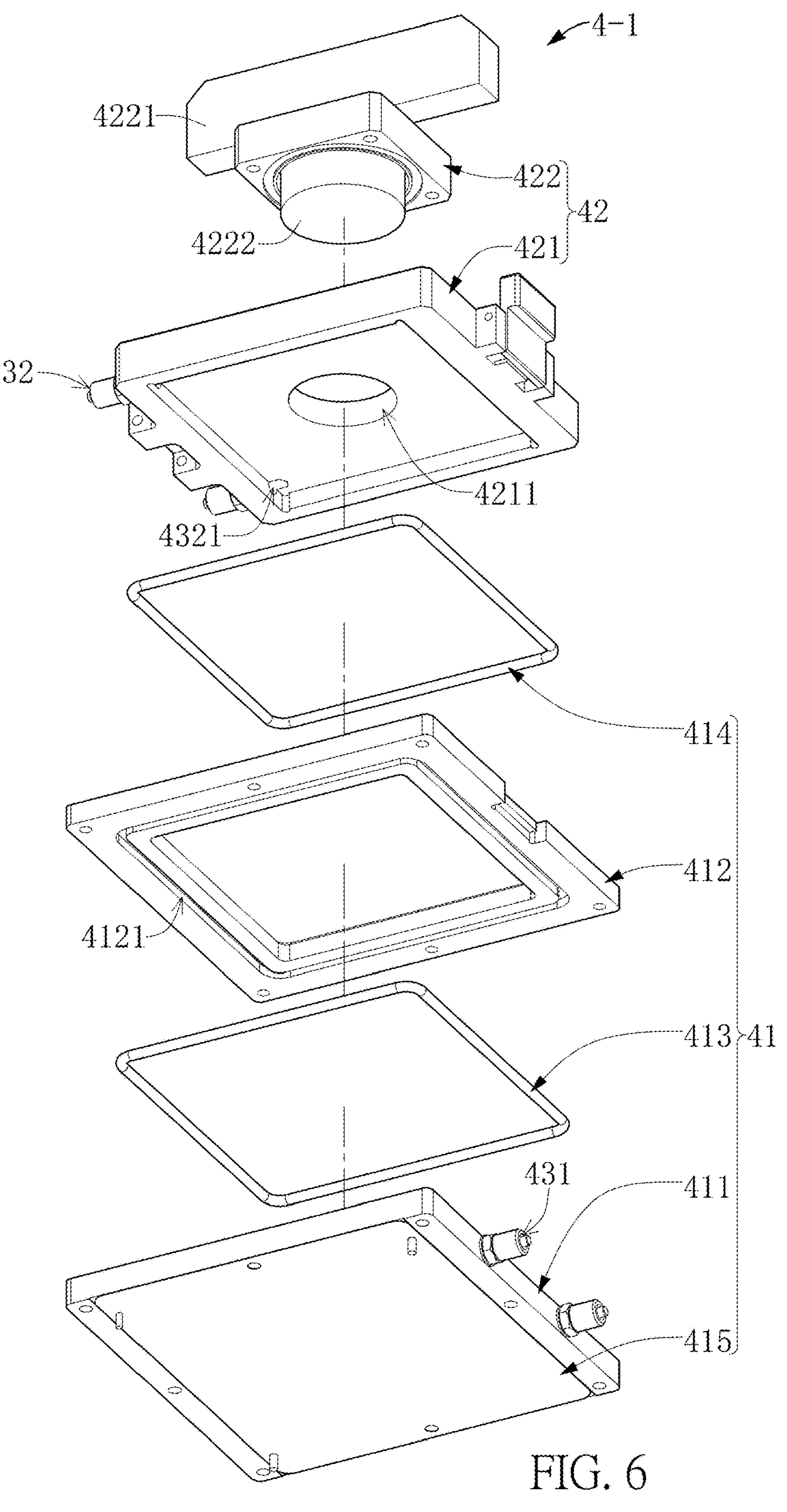
FIG. 6 is a schematic exploded view of a single test socket of FIG. 4 from another angle of view.

As shown in FIG. 2 to FIG. 4, the contactless test device 4 in the present embodiment includes a circuit board 4-2, a single test socket 4-1 assembled onto the circuit board 4-2, and a gas pressure module 4-3 that is connected to the single test socket 4-1. The gas pressure module 4-3 is connected in-between the control valve 12 and the pressurizing and drying mechanism 3, so that the gas pressure module 4-3 allows the dry gas to be injected into the single test socket 4-1 from the pressure-resistant container 1, and the pressurizing and drying mechanism 3 can recycle gas outputted from the single test socket 4-1, but the present disclosure is not limited thereto.

For example, in other embodiments of the present disclosure not shown in the drawings, the circuit board 4-2 of the contactless test device 4 can be omitted or can be replaced by other components; or, the gas pressure module 4-3 is not connected to the pressurizing and drying mechanism 3. The following description describes the structure of the single test socket 4-1, and then describes connection relationships between the single test socket 4-1 and any one of the circuit board 4-2 and the gas pressure module 4-3.

Figure 7:
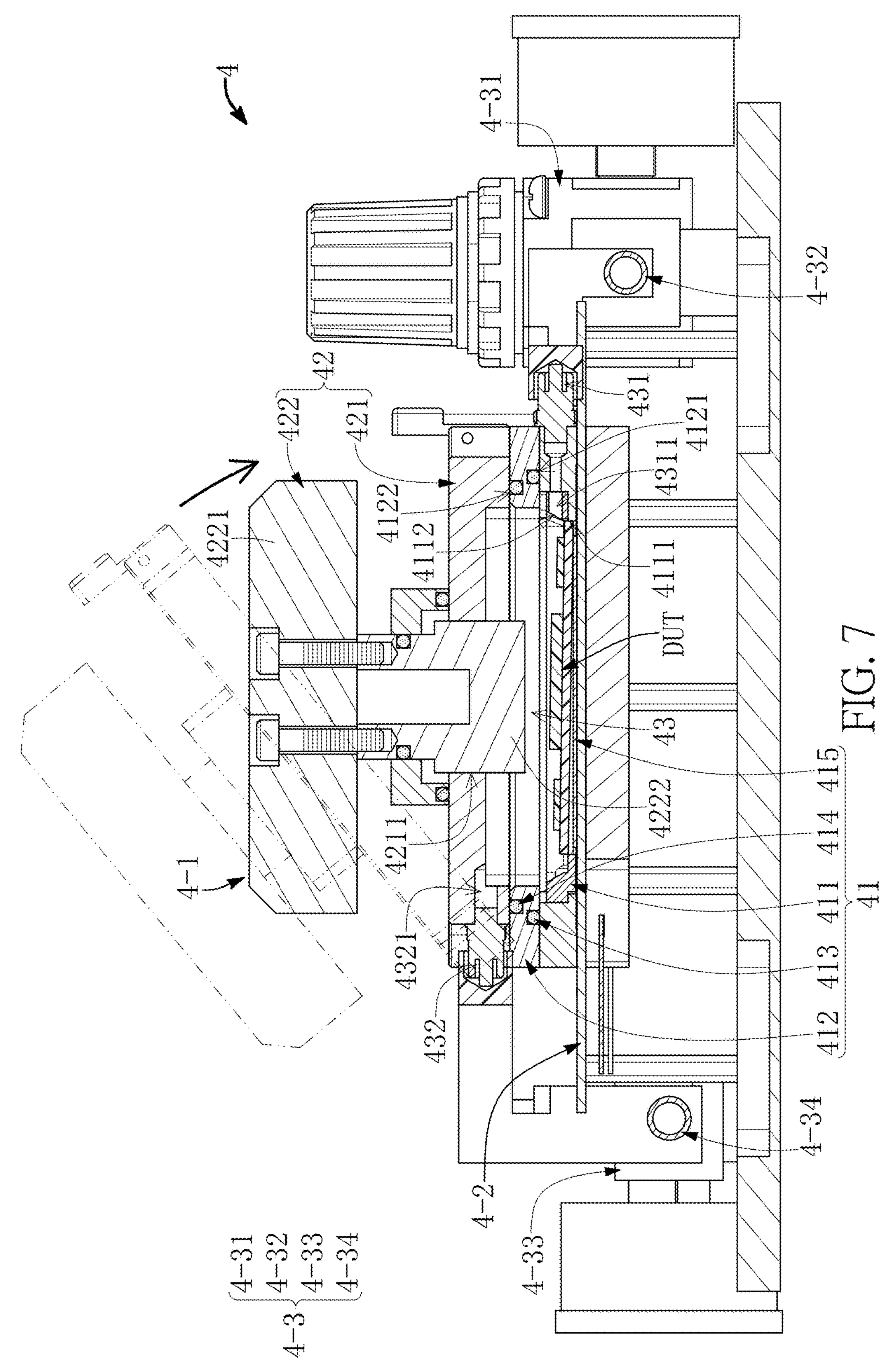
FIG. 7 is a schematic cross-sectional view taken along line VII-VII of FIG. 3.
Figure 8:
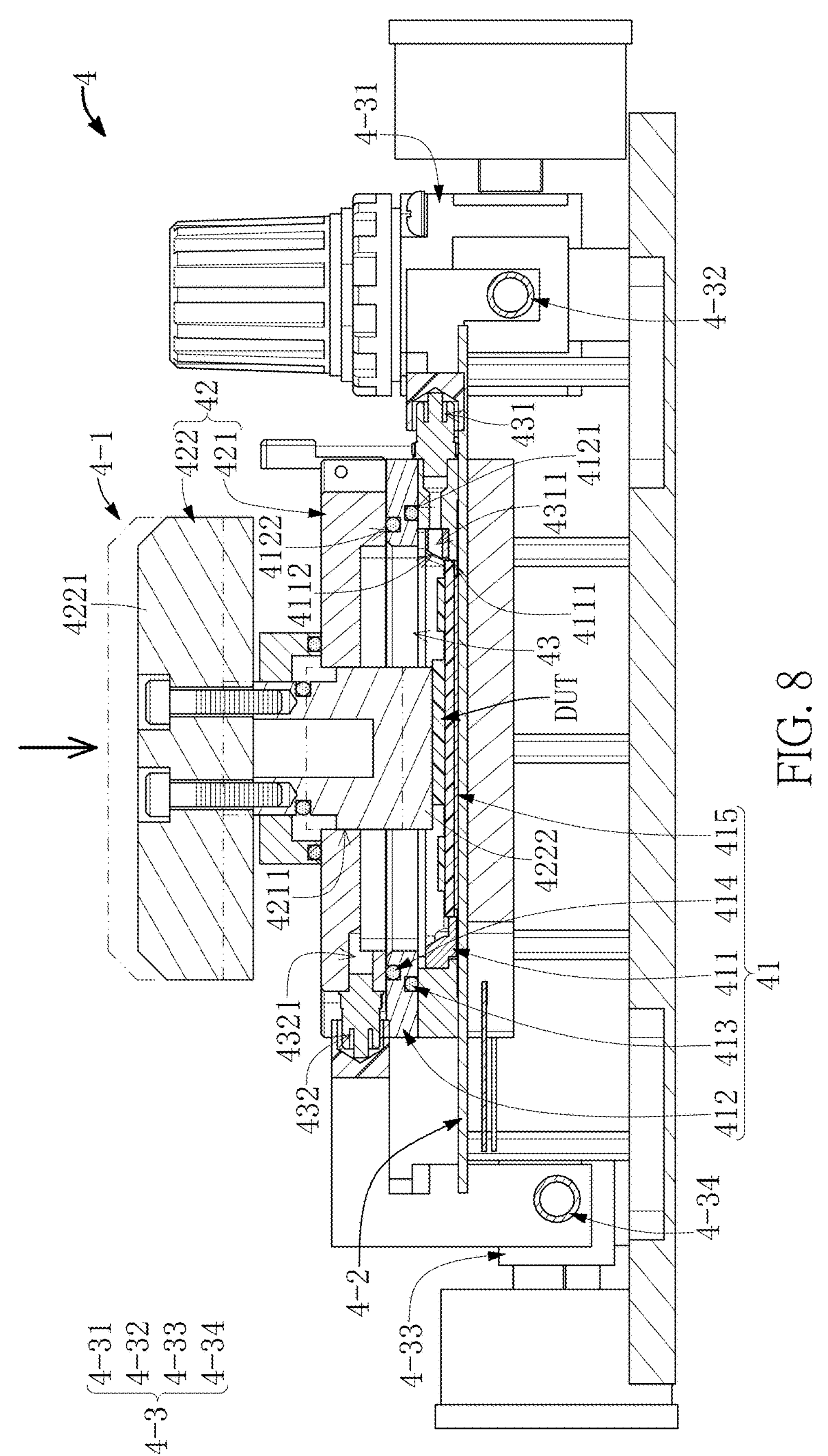
FIG. 8 is a schematic cross-sectional view showing a follow-up step of the single test socket in FIG. 7.

The single test socket 4-1 in the present embodiment is configured to perform an electrical test to a single device under test DUT (as shown in FIG. 7 and FIG. 8), and the device under test DUT can be a high-power electronic component (e.g., a system-in-package component). In other words, the single test socket 4-1 in the present embodiment cannot be used to simultaneously test more than one electronic component.

As shown in FIG. 5 to FIG. 8, the single test socket 4-1 includes a lower chamber 41 and an upper chamber 42 that is detachably assembled to the lower chamber 41, and the upper chamber 42 can cover onto the lower chamber 41 so as to jointly define a gas mixing room 43. The single test socket 4-1 (e.g., at least one of the lower chamber 41 and the upper chamber 42) has a gas input channel 431 and a gas output channel 432 that are in spatial communication with the gas mixing room 43, and the gas pressure module 4-3 is connected to the gas input channel 431 and the gas output channel 432.

Moreover, the gas mixing room 43 is in spatial communication with an external space only through the gas input channel 431 and the gas output channel 432, so that an interior environment of the gas mixing room 43 is only controlled by the gas pressure module 4-3 (e.g., a connection interface between the lower chamber 41 and the upper chamber 42 is sealed). In other words, the gas pressure module 4-3 is connected to the control valve 12 of the pressure-resistant container 1 for allowing the dry gas to be injected into the gas mixing room 43 from the pressure-resistant container 1, whereby the gas mixing room 43 has the predetermined test environment for allowing the electrical test to be performed on the device under test DUT.

Specifically, the lower chamber 41 includes a signal transmitting board 415 arranged on a bottom portion thereof, and the single test socket 4-1 is assembled onto the circuit board 4-2 through the signal transmitting board 415 of the lower chamber 41 (e.g., the signal transmitting board 415 and the circuit board 4-2 are electrically coupled to each other). Moreover, the lower chamber 41 is configured to allow the device under test DUT to be tightly fitted with an inner wall 4111 thereof and to be disposed on the signal transmitting board 415, such that the device under test DUT is electrically coupled to the circuit board 4-2 through the signal transmitting board 415.

In summary, the gas mixing room 43 formed in the contactless test device 4 (or the single test socket 4-1) provided by the present embodiment has a volume being only suitable for a single one of the device under tests DUT, so that the gas mixing room 43 can be used to quickly establish the predetermined test environment and to quickly dissipate heat generated from the device under test DUT, thereby effectively saving energy used in test and increasing the overall testing efficiency.

In addition, the contactless test device 4 can achieve the above technical effect by being formed of different structures, and the following description describes the contactless test device 4 of one of the different structures having a preferred test efficiency, but the present disclosure is not limited thereto. For example, in other embodiments of the present disclosure not shown in the drawings, the contactless test device 4 can have a part of the following features.

In the present embodiment, the gas input channel 431 is formed in the lower chamber 41, the gas output channel 432 is formed in the upper chamber 42, and the volume of the gas mixing room 43 is preferably within a range from 2 times to 10 times of a volume of the device under test DUT. Moreover, any one of the lower chamber 41 and the upper chamber 42 in the present embodiment is provided by assembling multiple pieces, and can be adjusted to be a single one-piece structure according to design requirements.

The lower chamber 41 in the present embodiment includes a first frame 411, a second frame 412 assembled to the first frame 411, an inner elastic gasket 413 sandwiched between the first frame 411 and the second frame 412, and an outer elastic gasket 414 that is sandwiched between the second frame 412 and the upper chamber 42. Each of the first frame 411, the second frame 412, the inner elastic gasket 413, and the outer elastic gasket 414 has a rectangular shape or a square shape, and surrounds at an outer side of the gas mixing room 43.

Moreover, the signal transmitting board 415 is assembled to a bottom of the first frame 411 for being jointly disposed on the circuit board 4-2. In other words, a lower-half portion of the first frame 411 adjacent to the signal transmitting board 415 has the inner wall 4111 that is tightly fitted with the device under test DUT, and the first frame 411 further has a guiding slanting surface 4112 connected to the inner wall 4111 for guiding the device under test DUT into the inner wall 4111.

Specifically, the gas input channel 431 is formed in the first frame 411 and has a gas inlet 4311 that is arranged at the gas mixing room 43 and that is higher in position than the device under test DUT (or the inner wall 4111) with respect to the signal transmitting board 415. In the present embodiment, the gas inlet 4311 is formed on the guiding slanting surface 4112, and a specific length and a structure of the gas input channel 431 can be changed or adjusted according to design requirements, but the present disclosure is not limited thereto.

The second frame 412 has an inner ring-shaped groove 4121 recessed in a bottom surface thereof and an outer ring-shaped groove 4122 that is recessed in a top surface thereof. The inner elastic gasket 413 is disposed in the inner ring-shaped groove 4121 and partially protrudes from the inner ring-shaped groove 4121. The outer elastic gasket 414 is disposed in the outer ring-shaped groove 4122 and partially protrudes from the outer ring-shaped groove 4122.

Moreover, the second frame 412 is threaded to the first frame 411, and the bottom surface of the second frame 412 compresses the inner elastic gasket 413 and further abuts against the first frame 411, so that the connection interface between the first frame 411 and the second frame 412 is sealed through the inner elastic gasket 413 being elastically deformed. An inner wall of the second frame 412 is located outside of the guiding slanting surface 4112 of the first frame 411, and an outer lateral edge of the second frame 412 is flush with an outer lateral edge of the first frame 411.

In other embodiments of the present disclosure not shown in the drawings, the first frame 411 and the second frame 412 can be integrally formed as a single-one piece structure, such that the lower chamber 41 can be provided without the inner elastic gasket 413.

The upper chamber 42 is detachably assembled to the lower chamber 41 (e.g., the second frame 412), and the upper chamber 42 in the present embodiment includes a covering plate 421 and a positioning mechanism 422 that is assembled to the covering plate 421. The gas output channel 432 is formed in the covering plate 421 and has a gas outlet 4321 that is arranged at the gas mixing room 43 and that is higher in position than the device under test DUT (and the gas inlet 4311) with respect to the signal transmitting board 415.

The covering plate 421 has a thru-hole 4211 substantially arranged on a center portion thereof. The positioning mechanism 422 is assembled to the covering plate 421 in a manipulable manner and is arranged in the thru-hole 4211. The positioning mechanism 422 includes a manipulation portion 4221 arranged outside of the gas mixing room 43 and a pressing portion 4222 that is arranged in the gas mixing room 43. An interface between the positioning mechanism 422 and a wall defining the thru-hole 4211 is sealed, and the manipulation portion 4221 is rotatable to drive the pressing portion 4222 to be moved toward or away from the signal transmitting board 415.

In summary, the positioning mechanism 42 is configured to move the pressing portion 4222 toward the signal transmitting board 415 through the manipulation portion 4221, thereby allowing the pressing portion 4222 to abut against the device under test DUT and enabling the device under test DUT to be flatly disposed onto the signal transmitting board 415. In other words, the volume of the gas mixing room 43 is controlled to be a small value, so that a gas environment of the gas mixing room 43 is easily controlled, and a movement of the pressing portion 422 can be shortened, thereby increasing the test efficiency.

In addition, the covering plate 421 is detachably assembled to the lower chamber 41, one side of the covering plate 421 is pivotally connected to the lower chamber 41 (e.g., one side of the second frame 412), and another side of the covering plate 421 is detachably engaged with the lower chamber 41 (e.g., another side of the second frame 412), so that the covering plate 421 compresses the outer elastic gasket 414 and further abuts against the second frame 412. Accordingly, the connection interface between the covering plate 421 and the second frame 412 is sealed through the outer elastic gasket 414 being elastically deformed.

In summary, since the structural design and cooperation of the upper chamber 42 and the lower chamber 41, the gas mixing room 43 defined by the upper chamber 42 and the lower chamber 41 is capable of bearing a pressure that is greater than 1 atm (e.g., the gas mixing room 43 being capable of bearing of a pressure within a range from 1.5 atm to 6 atm). Accordingly, the gas mixing room 43 can have a high density of gas molecules, thereby effectively increasing a heat exchange efficiency between the dry gas and the device under test DUT, and facilitating a quick adjustment of environment parameters of the gas mixing room 43.

In other embodiments of the present disclosure not shown in the drawings, the upper chamber 42 can only include the covering plate 421 having no thru-hole 4211 and is provided without the positioning mechanism 422; or, the covering plate 421 can be detachably assembled to the lower chamber 41 in a manner (e.g., a threaded manner) other than the pivotal connection manner and the engagement manner according to design requirements.

In addition, the gas pressure module 4-3 of the present embodiment includes a gas input valve 4-31 connected to the control valve 12, a gas input pipe 4-32 connecting the gas input valve 4-31 and the gas input channel 431, a gas output valve 4-33 connected to the pressurizing and drying mechanism 3, and a gas output pipe 4-34 that connects the gas output valve 4-33 and the gas output channel 432. The gas pressure module 4-3 can use the gas input valve 4-31 and the gas input pipe 4-32 to input the dry gas into the gas mixing room 43 along the gas input channel 431, but the present disclosure is not limited thereto.

Moreover, the gas output valve 4-33 and the gas output pipe 4-34 of the gas pressure module 4-3 can be used to control the gas mixing room 43 to output the gas therein. In other words, the gas pressure module 4-3 can effectively control environment parameters of the gas mixing room 43 to form the predetermined test environment through the gas input valve 4-31 and the gas output valve 4-33.

Second Embodiment

Figure 9:
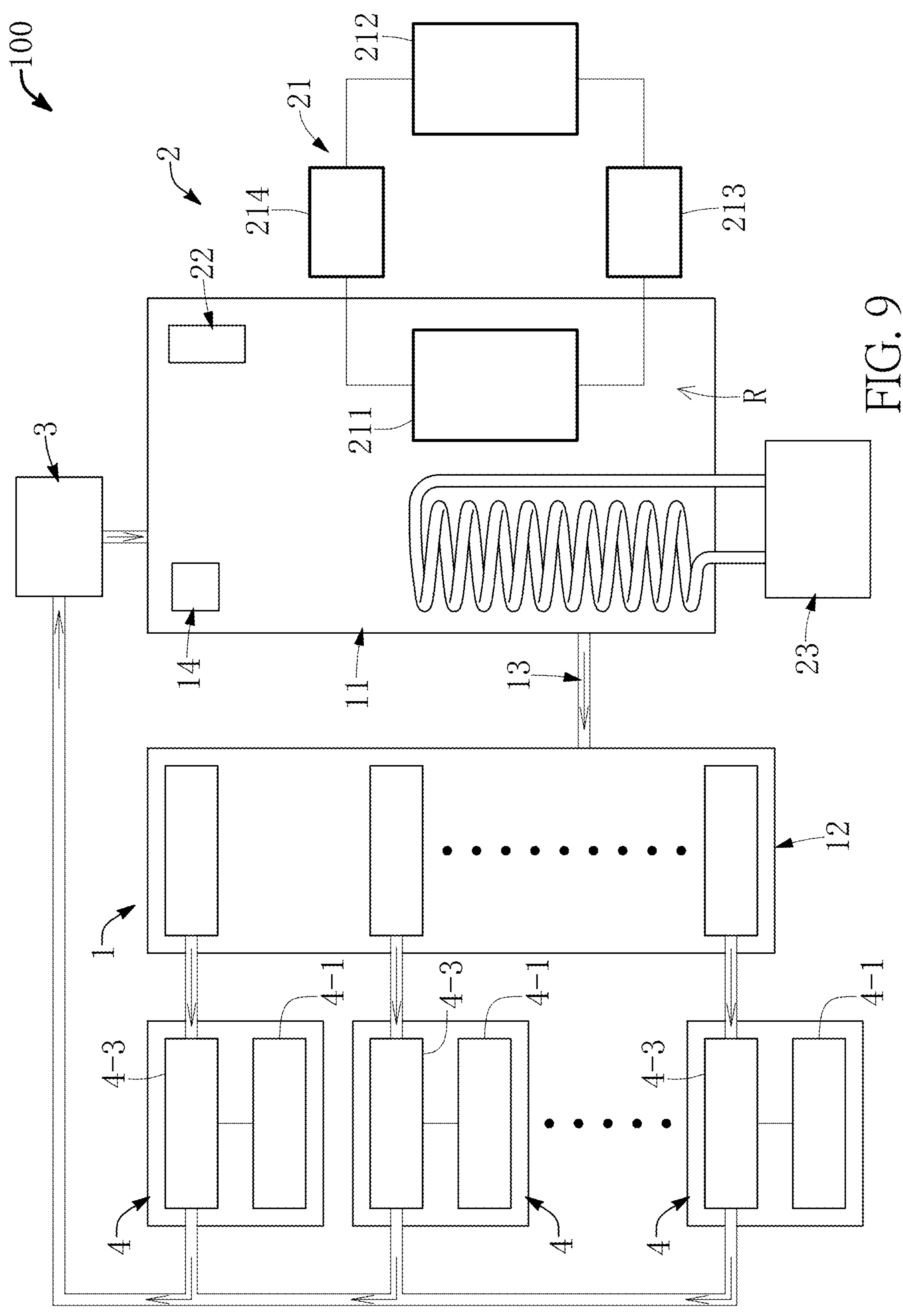
FIG. 9 is a schematic view of the test environment control system according to a second embodiment of the present disclosure.

Referring to FIG. 9, a second embodiment of the present disclosure, which is similar to the first embodiment of the present disclosure, is provided. For the sake of brevity, descriptions of the same components in the first and second embodiments of the present disclosure will be omitted herein, and the following description only discloses different features between the first and second embodiments.

In the present embodiment, the temperature control device 2 includes a first heat exchanger 21 and a second heat exchanger 23. The first heat exchanger 21 in the present embodiment is the cooling mechanism 21 provided by the first embodiment, and the second heat exchanger 23 can be further limited to a liquid nitrogen heat exchanger or a liquid helium heat exchanger, but the present disclosure is not limited thereto.

Specifically, each of the first heat exchanger 21 and the second heat exchanger 23 is at least partially arranged in the gas storage room R (or the first pressure-resistant tank 11) and immersed in the dry gas. Moreover, an operation power of the second heat exchanger 23 is higher than an operation power of the first heat exchanger 21, the first heat exchanger 21 has a first cooling critical value, and the second heat exchanger 23 has a second cooling critical value that is less than the first cooling critical value. For example, a difference between the first cooling critical value of the first heat exchanger 21 and the second cooling critical value of the second heat exchanger 23 is preferably at least 20° C.

Moreover, the temperature control device 2 is configured to reduce a temperature of the dry gas in the gas storage room R to the first cooling critical value through the first heat exchanger 21, and then further to reduce the temperature of the dry gas from the first cooling critical value to the predetermined temperature through the second heat exchanger 23. The predetermined temperature is greater than or equal to the second cooling critical value.

Accordingly, in the test environment control system of the present embodiment, the dry gas in the pressure-resistant container 1 is reserved in advance, and the first heat exchanger 21 and the second heat exchanger 23 having different operation powers can be selectively used at different periods, thereby effectively saving energy.

Third Embodiment

Figure 10:
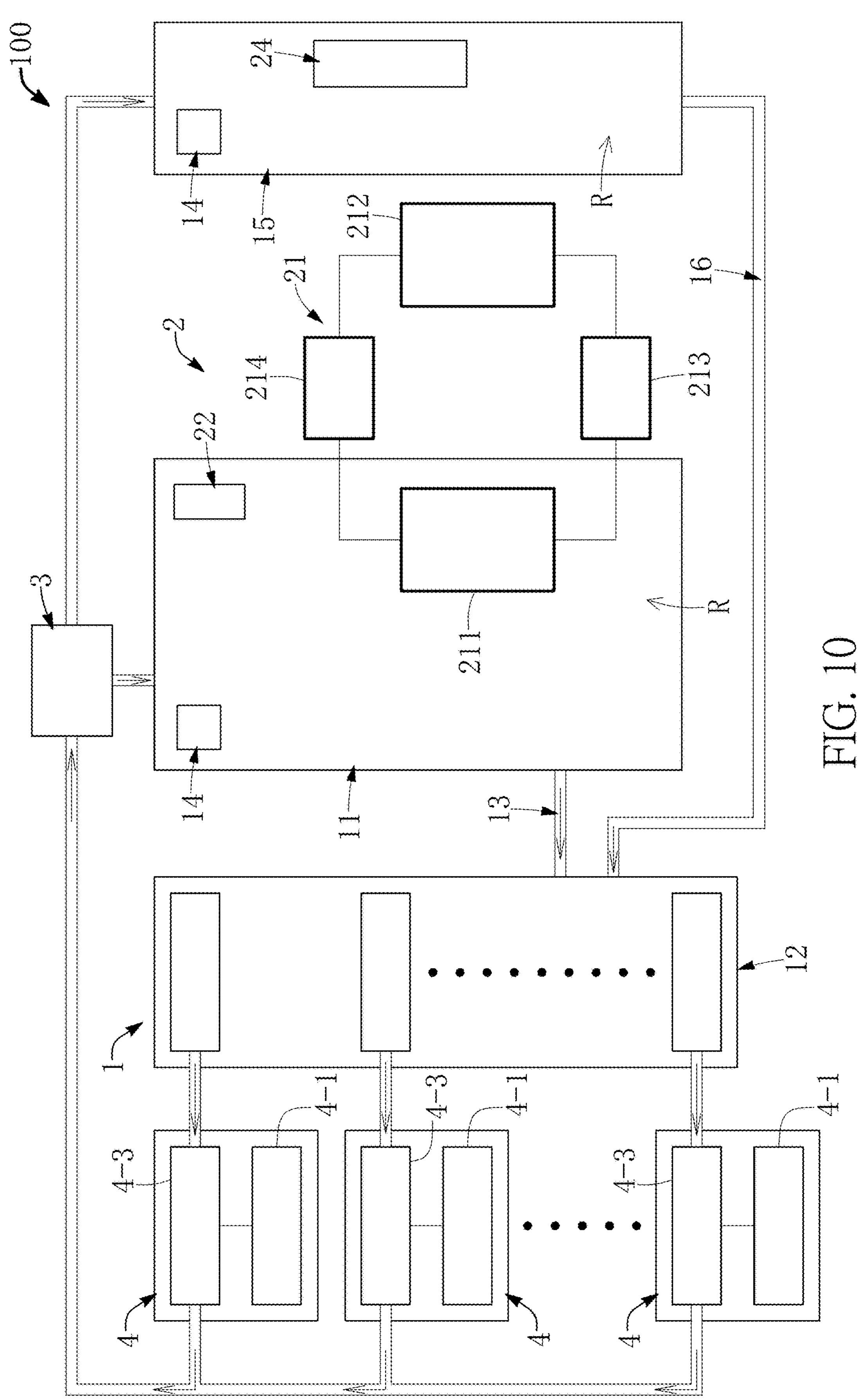
FIG. 10 is a schematic view of the test environment control system according to a third embodiment of the present disclosure.

Referring to FIG. 10, a third embodiment of the present disclosure, which is similar to the first embodiment of the present disclosure, is provided. For the sake of brevity, descriptions of the same components in the first and third embodiments of the present disclosure will be omitted herein, and the following description only discloses different features between the first and third embodiments.

In the present embodiment, the pressure-resistant container 1 further includes a second pressure-resistant tank 15 connected to the pressurizing and drying mechanism 3 and a second output pipe 16 that connects the second pressure-resistant tank 15 and the control valve 12. Moreover, each of an interior space of the first pressure-resistant tank 11 and an interior space of the second pressure-resistant tank 15 is defined as a part of the gas storage room R. In other words, the gas storage room R in the present embodiment is jointly defined by the interior space of the first pressure-resistant tank 11 and the interior space of the second pressure-resistant tank 15.

Specifically, the temperature control device 2 further includes a heating mechanism 24 at least partially arranged in the second pressure-resistant tank 15 for increasing a temperature of the dry gas in the second pressure-resistant tank 15. The control valve 12 of the pressure-resistant container 1 is configured to selectively output the dry gas from at least one of the first pressure-resistant tank 11 and the second pressure-resistant tank 15, so as to enable the dry gas outputted from the gas storage room R to have the predetermined temperature.

Beneficial Effects of the Embodiments

In conclusion, the test environment control system in the present disclosure can be provided with the pressure-resistant container for pre-storing the dry gas having the predetermined temperature, so that the control valve can input the dry gas into any one of the contactless test devices for quickly establishing the predetermined test environment, thereby effectively increasing an overall testing efficiency.

Moreover, in the test environment control system of the present disclosure, the dry gas in the pressure-resistant container is reserved in advance, and the first heat exchanger and the second heat exchanger having different operation powers can be selectively used at different periods, thereby effectively saving energy.

In addition, the gas mixing room formed in the contactless test device provided by the present disclosure has a volume being only suitable for a single one of the device under test, so that the gas mixing room can be used to quickly establish the predetermined test environment and to quickly dissipate heat generated from the device under test, thereby effectively saving energy used in test and increasing the overall testing efficiency.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A test environment control system, comprising:

a pressure-resistant container including a gas storage room and a control valve that is in spatial communication with the gas storage room, wherein the gas storage room is configured to store a dry gas that has a dew point temperature being less than −10° C. and that has a pressure being greater than 1 atm;

a temperature control device at least partially arranged in the gap gas storage room and immersed in the dry gas, wherein the temperature control device is configured to control the dry gas in the gas storage room to arrive at a predetermined temperature; and a plurality of contactless test devices connected to the control valve of the pressure-resistant container, wherein the control valve of the pressure-resistant container is configured to output the dry gas having the predetermined temperature from the gas storage room to a N number of the contactless test devices, selectively, for establishing a predetermined test environment in each of the N number of the contactless test devices, and wherein N is a positive integer, and at least one of the contactless test devices includes:

a single test socket configured to perform an electrical test to a single device under test (DUT) and including:

a lower chamber including a signal transmitting board arranged on a bottom portion thereof, wherein the lower chamber is configured to allow the DUT to be tightly fitted with an inner wall thereof and to be disposed on the signal transmitting board; and an upper chamber that is detachably assembled onto the lower chamber so as to jointly define a gas mixing room, wherein the single test socket has a gas input channel and a gas output channel that are in spatial communication with the gas mixing room, and the gas mixing room is in spatial communication with an external space only through the gas input channel and the gas output channel; and a gas pressure module connected to the gas input channel and the gas output channel, wherein the gas pressure module is connected to the control valve of the pressure-resistant container for allowing the dry gas to be injected into the gas mixing room from the pressure-resistant container, whereby the gas mixing room has the predetermined test environment for allowing the electrical test to be performed on the DUT.

2. The test environment control system according to claim 1, wherein the lower chamber includes a first frame and a second frame that is assembled to the first frame, wherein the signal transmitting board is assembled to the first frame, and the gas input channel is formed in the first frame and has a gas inlet that is arranged at the gas mixing room and that is higher in position than the DUT with respect to the signal transmitting board, and wherein the upper chamber includes:

a covering plate detachably assembled to the second frame and having the gas output channel and a thru-hole; and a positioning mechanism assembled to the covering plate and arranged in the thru-hole, wherein the positioning mechanism includes a manipulation portion arranged outside of the gas mixing room and a pressing portion that is arranged in the gas mixing room;

wherein the positioning mechanism is configured to move the pressing portion toward the signal transmitting board through the manipulation portion for allowing the pressing portion to abut against the DUT and enabling the DUT to be flatly disposed onto the signal transmitting board.

3. The test environment control system according to claim 2, wherein one side of the covering plate is pivotally connected to the lower chamber, and another side of the covering plate is detachably engaged with the lower chamber, whereby the gas mixing room defined by the upper chamber and the lower chamber is capable of bearing a pressure that is greater than 1 atm.

4. A test environment control system, comprising:

a pressure-resistant container including a gas storage room and a control valve that is in spatial communication with the gas storage room, wherein the gas storage room is configured to store a dry gas that has a dew point temperature being less than −10° C. and that has a pressure being greater than 1 atm;

a temperature control device at least partially arranged in the gas storage room and immersed in the dry gas, wherein the temperature control device is configured to control the dry gas in the gas storage room to arrive at a predetermined temperature; and a plurality of contactless test devices connected to the control valve of the pressure-resistant container, wherein the control valve of the pressure-resistant container is configured to output the dry gas having the predetermined temperature from the gas storage room to a N number of the contactless test devices, selectively, for establishing a predetermined test environment in each of the N number of the contactless test devices, and wherein N is a positive integer;

wherein the pressure-resistant container includes a first pressure-resistant tank and a first output pipe that connects the first pressure-resistant tank and the control valve, and an interior space of the first pressure-resistant tank is defined as at least part of the gas storage room, and wherein the temperature control device includes a cooling mechanism that is at least partially arranged in the first pressure-resistant tank for reducing a temperature of the dry gas in the first pressure-resistant tank.

5. The test environment control system according to claim 4, wherein the cooling mechanism includes:

an evaporator that is arranged in the first pressure-resistant tank for reducing the temperature of the dry gas in the first pressure-resistant tank;

a condenser arranged outside of the first pressure-resistant tank;

an expansion valve connected in-between an inlet of the evaporator and an outlet of the condenser; and a compressor connected in-between an outlet of the evaporator and an inlet of the condenser.

6. The test environment control system according to claim 5, wherein the temperature control device includes a heater arranged on the first pressure-resistant tank for adjusting the temperature of the dry gas in the first pressure-resistant tank.

7. The test environment control system according to claim 4, wherein the pressure-resistant container includes a second pressure-resistant tank and a second output pipe that connects the second pressure-resistant tank and the control valve, and an interior space of the second pressure-resistant tank is defined as a part of the gas storage room, wherein the temperature control device includes a heating mechanism that is at least partially arranged in the second pressure-resistant tank for increasing a temperature of the dry gas in the second pressure-resistant tank, and wherein the control valve of the pressure-resistant container is configured to selectively output the dry gas from at least one of the first pressure-resistant tank and the second pressure-resistant tank, so as to enable the dry gas outputted from the gas storage room to have the predetermined temperature.

8. The test environment control system according to claim 4, further comprising a pressurizing and drying mechanism connected to the gas storage room, wherein the pressurizing and drying mechanism is configured to provide the gas storage room with the dry gas that has the dew point temperature being within a range from −30° C. to −100° C. and that has the pressure being within a range from 1.5 atm to 6 atm.

9. A test environment control system, a pressure-resistant container including a gas storage room and a control valve that is in spatial communication with the gas storage room, wherein the gas storage room is configured to store a dry gas that has a dew point temperature being less than −10°° C. and that has a pressure being greater than 1 atm;

a temperature control device at least partially arranged in the gas storage room and immersed in the dry gas, wherein the temperature control device is configured to control the dry gas in the gas storage room to arrive at a predetermined temperature; and a plurality of contactless test devices connected to the control valve of the pressure-resistant container, wherein the control valve of the pressure-resistant container is configured to output the dry gas having the predetermined temperature from the gas storage room to a N number of the contactless test devices, selectively, for establishing a predetermined test environment in each of the N number of the contactless test devices, and wherein N is a positive integer;

wherein the temperature control device includes:

a first heat exchanger at least partially arranged in the gas storage room and immersed in the dry gas, wherein the first heat exchanger has a first cooling critical value; and a second heat exchanger at least partially arranged in the gas storage room and immersed in the dry gas, wherein an operation power of the second heat exchanger is higher than an operation power of the first heat exchanger, and the second heat exchanger has a second cooling critical value that is less than the first cooling critical value;

wherein the temperature control device is configured to reduce a temperature of the dry gas in the gas storage room to the first cooling critical value through the first heat exchanger, and then further to reduce the temperature of the dry gas from the first cooling critical value through the second heat exchanger.

10. The test environment control system according to claim 9, wherein the temperature control device is configured to reduce the temperature of the dry gas from the first cooling critical value to a predetermined temperature through the second heat exchanger, the predetermined temperature being greater than or equal to the second cooling critical value.

11. The test environment control system according to claim 9, wherein a difference between the first cooling critical value of the first heat exchanger and the second cooling critical value of the second heat exchanger is at least 20° C.

12. The test environment control system according to claim 9, further comprising a pressurizing and drying mechanism connected to the gas storage room, wherein the pressurizing and drying mechanism is configured to provide the gas storage room with the dry gas that has the dew point temperature being within a range from −30° C. to −100° C. and that has the pressure being within a range from 1.5 atm to 6 atm.

13. The test environment control system according to claim 9, wherein at least one of the contactless test devices includes:

a single test socket configured to perform an electrical test to a single device under test (DUT) and including:

a lower chamber including a signal transmitting board arranged on a bottom portion thereof, wherein the lower chamber is configured to allow the DUT to be tightly fitted with an inner wall thereof and to be disposed on the signal transmitting board; and an upper chamber that is detachably assembled onto the lower chamber so as to jointly define a gas mixing room;

wherein the single test socket has a gas input channel and a gas output channel that are in spatial communication with the gas mixing room, and the gas mixing room is in spatial communication with an external space only through the gas input channel and the gas output channel; and a gas pressure module connected to the gas input channel and the gas output channel, wherein the gas pressure module is connected to the control valve of the pressure-resistant container for allowing the dry gas to be injected into the gas mixing room from the pressure-resistant container, whereby the gas mixing room has the predetermined test environment for allowing the electrical test to be performed on the DUT.

14. The test environment control system according to claim 13, wherein the lower chamber includes a first frame and a second frame that is assembled to the first frame, wherein the signal transmitting board is assembled to the first frame, and the gas input channel is formed in the first frame and has a gas inlet that is arranged at the gas mixing room and that is higher in position than the DUT with respect to the signal transmitting board, and wherein the upper chamber is detachably assembled to the second frame.

15. The test environment control system according to claim 14, wherein the upper chamber includes:

a covering plate detachably assembled to the second frame and having the gas output channel and a thru-hole; and a positioning mechanism assembled to the covering plate and arranged in the thru-hole, wherein the positioning mechanism includes a manipulation portion arranged outside of the gas mixing room and a pressing portion that is arranged in the gas mixing room;

wherein the positioning mechanism is configured to move the pressing portion toward the signal transmitting board through the manipulation portion for allowing the pressing portion to abut against the DUT and enabling the DUT to be flatly disposed onto the signal transmitting board.

16. The test environment control system according to claim 15, wherein one side of the covering plate is pivotally connected to the lower chamber, and another side of the covering plate is detachably engaged with the lower chamber, whereby the gas mixing room defined by the upper chamber and the lower chamber is capable of bearing a pressure that is greater than 1 atm.

17. The test environment control system according to claim 15, wherein the gas output channel is formed in the covering plate and has a gas outlet that is arranged at the gas mixing room and that is higher in position than the DUT with respect to the signal transmitting board, and the gas input channel is formed in the lower chamber.

18. The test environment control system according to claim 14, wherein the lower chamber includes:

an inner elastic gasket that is sandwiched between the first frame and the second frame and that surrounds an outer side of the gas mixing room; and an outer elastic gasket that is sandwiched between the second frame and the upper chamber and that surrounds the outer side of the gas mixing room.

19. The test environment control system according to claim 13, wherein the at least one of the contactless test devices includes a circuit board, wherein the single test socket is assembled onto the circuit board through the signal transmitting board, such that the DUT is electrically coupled to the circuit board through the signal transmitting board.

* * * * *